United States Patent [19]

Shirahata et al.

[11] 4,260,466
[45] Apr. 7, 1981

[54] METHOD OF PRODUCING MAGNETIC RECORDING MEDIUM

[75] Inventors: Ryuji Shirahata; Tatsuji Kitamoto; Yasuyuki Yamada; Goro Akashi, all of Odawara, Japan

[73] Assignee: Fuji Photo Film Co., Ltd., Minami-ashigara, Japan

[21] Appl. No.: 771,583

[22] Filed: Feb. 24, 1977

Related U.S. Application Data

[63] Continuation-in-part of Ser. No. 736,914, Oct. 29, 1976, abandoned, which is a continuation of Ser. No. 558,104, Mar. 13, 1975, abandoned.

[30] Foreign Application Priority Data

Mar. 13, 1974 [JP] Japan .................................. 49/28844

[51] Int. Cl.$^3$ ............................................. H01F 10/02
[52] U.S. Cl. ................................. 204/192 M; 427/35; 427/36; 427/38; 427/44; 427/54.1; 427/132; 427/296; 427/302
[58] Field of Search ............................... 427/127–132, 427/48, 35, 38, 36, 44, 54.1, 132, 296, 302; 204/192 M

[56] References Cited

U.S. PATENT DOCUMENTS

| | | |
|---|---|---|
| 3,278,441 | 10/1966 | Manuel et al. .................. 427/128 X |
| 3,690,932 | 9/1972 | Geffcken et al. ................ 427/248 X |
| 3,713,869 | 1/1973 | Geffcken et al. ................ 427/41 X |

FOREIGN PATENT DOCUMENTS 1072049 6/1967 United Kingdom .

Primary Examiner—Bernard D. Pianalto
Attorney, Agent, or Firm—Sughrue, Rothwell, Mion, Zinn and Macpeak

[57] ABSTRACT

A method of producing a magnetic recording layer on a support comprising simultaneously depositing a ferromagnetic material and a polymer on a support using a vapor deposition technique such as vacuum deposition, sputtering, etc., thereby to produce thereon a magnetic recording layer of a composite film of the ferromagnetic material and the polymer. A further embodiment for producing a magnetic recording layer comprises simultaneously depositing a ferromagnetic material and a monomer or oligomer on the support using a vapor deposition technique, polymerizing the deposited layer, e.g., using a polymerization catalyst or by applying ionizing or electromagnetic rays thereto, to form a composite film of the ferromagnetic material and the polymer. The magnetic recording layer thus obtained in either embodiment can be used for high density recording.

19 Claims, 3 Drawing Figures

METHOD OF PRODUCING MAGNETIC RECORDING MEDIUM

This application is a continuation-in-part of U.S. Ser. No. 736,914 filed Oct. 29, 1976 which is a continuation of U.S. Ser. No. 558,104 filed Mar. 13, 1975 both now abandoned.

BACKGROUND OF THE INVENTION

1. Field of the Invention

This invention relates to a method of producing a magnetic recording medium, and more particularly to a novel method of producing a magnetic recording medium by using a vapor deposition technique.

2. Description of the Prior Art

A coating type magnetic recording medium which is produced by dispersing a powdery magnetic recording material of $\gamma$-$Fe_2O_3$, $\gamma$-$Fe_2O_3$ doped with Co, $Fe_3O_4$, $CrO_2$ or a ferromagnetic alloy powder in an organic binder of vinyl chloride-vinyl acetate copolymer, styrene-butadiene copolymer, epoxy resin or polyurethane resin, coating the dispersion on a non-magnetic support, and drying the coating has been widely employed as a magnetic recording medium. Recently, with the increase in demand for high density recording, a ferromagnetic metal thin film, produced by methods that include electrical plating, electroless plating, sputtering, vacuum deposition and ion plating, has attracted the attention of many researchers as a so called a non-binder type magnetic recording medium, which does not employ a binder, and various efforts have been carried out for practical applications.

Since metal oxides with a lower saturation magnetic flux density (Bm) than that of ferromagnetic metals have mainly been used as magnetic materials, known coating type magnetic recording media have disadvantages in that reduction of the magnetic layer thickness required for high density recording approach a limit because a decrease in signal output occurs, in that their production processes are complicated, and in that a large scale of incidental facilities for the purpose of solvent recovery and pollution control are required therefor. Since thin films of ferromagnetic metals with a higher saturation magnetic flux density than that of metal oxides can be made without the need for the presence of non-magnetic materials such as binders, non-binder type magnetic recording media have the advantage that magnetic recording media with a very thin structure can be obtained for the purpose of high density recording. However, since non-binder type magnetic recording media are composed of continuous thin metal films where the electrical conductivity is increased, they may have the disadvantages that unwanted noise is generated and that the recording magnetization is decreased due to the eddy current generated when electrical signals are recorded on the media using a magnetic head. Further, since non-binder type magnetic recording media comprise continuous magnetic thin films, saw tooth transition regions may result when magnetic recording is performed. Therefore, these non-binder type magnetic recording media have the disadvantage that high density recording corresponding to a recording wavelength below the width of the magnetized transition regions is impossible. More further, incidental facilities for pollution control may be required for the fabrication of the non-binder type magnetic recording media when such are produced using plating techniques.

SUMMARY OF THE INVENTION

One of the prime objects of the present invention is to provide a novel method of making magnetic recording media eliminating the above-described disadvantages.

This invention in one embodiment comprises a method of producing a magnetic recording medium comprising vapor depositing simultaneously both a ferromagnetic material and a polymer onto a support to provide a magnetic recording layer thereon.

Further, in a second embodiment, this invention comprises a method of producing a magnetic recording medium comprising vapor depositing simultaneously both a ferromagnetic material and a monomer or an oligomer onto a support to produce a deposited layer thereon, and polymerizing the monomer or the oligomer in the deposited layer to form a magnetic recording layer on the support.

All of the objects, features and advantages of this invention and the manner of attaining them will become more apparent and the invention itself will be best understood by reference to the following description of the invention taken in conjunction with the accompanying drawings.

DETAILED DESCRIPTION OF THE INVENTION

Figure 1:
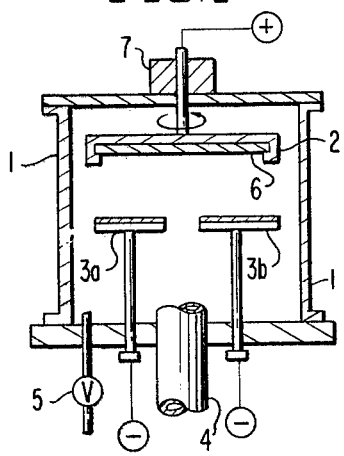
FIG. 1 is a schematic view of a production apparatus for producing magnetic recording media according to an embodiment of the invention.

According to one embodiment of the invention, a method of producing a magnetic recording medium comprises depositing simultaneously a ferromagnetic material of a ferromagnetic metal and a polymer on a support using a vapor deposition technique such as vacuum deposition or sputtering to form thereon a composite magnetic recording layer of the ferromagnetic material and the polymer.

According to another embodiment of the invention, the production of a magnetic recording medium comprises depositing simultaneously a ferromagnetic material and a monomer or oligomer on a support using a vapor deposition technique such as vacuum deposition or sputtering, and polymerizing the depositing layer, e.g., using a polymerization catalyst or by applying ionizing or electromagnetic rays thereto, thereby to form on the support a composite magnetic recording layer of the ferromagnetic material and the polymer.

The term "vapor deposition techniques" as used in this invention designates techniques for depositing on a substrate a material to be deposited or a compound of the material in the form of a vapor or an ionized vapor, and includes vacuum deposition, sputtering, ion plating, ion beam deposition, chemical vapor deposition and the like.

It has now been found that when a magnetic recording medium is produced by depositing simultaneously a ferromagnetic material and a polymer, or depositing simultaneously a ferromagnetic material and a monomer or oligomer on a support using such a vapor deposition technique, the magnetic recording medium thus produced has improved magnetic properties, particularly, an improved coercive force which is greater than that of conventional magnetic recording medium produced using known vacuum deposition techniques and also adheres well to the support. For recording and reproduction using the magnetic recording medium according to the invention, a higher output than that of conventional coating type magnetic recording medium can be obtained, and the magnetic recording medium according to the invention is capable of high output in short recording wavelength regions as compared with a non-binder type magnetic recording medium.

The reason why a reproduction output level higher than that of conventional magnetic recording medium of a non-binder type ferromagnetic thin metal film is obtained in the high density recording region, could be that since ferromagnetic particles with high saturation magnetic flux density (Bm) are buried in the polymer in the magnetic recording medium according to the invention and are moderately dispersed therein, each of the ferromagnetic particles acts as a single magnetic domain to improve the magnetic properties and because the generation of saw tooth transition regions as observed in continuous magnetic thin films and loss due to eddy current is decreased.

According to the method of producing the magnetic recording medium of this invention, excellent advantages can be obtained in that complicated production processes such as in known production processes for magnetic materials, the production of coating solutions and the coatings are not required and that problems such as solvent recovery and pollution control do not result.

Suitable ferromagnetic materials which can be used in the invention include the following materials: Fe, Co, Ni, ferromagnetic metals; magnetic alloys such as Fe-Co, Fe-Ni, Co-Ni, Fe-Rh, Fe-Cu, Fe-Au, Co-Cu, Co-Au, Co-Y, Co-La, Co-Pr, Co-Gd, Co-Ga, Co-Sm, Co-Pt, Ni-Cu, Fe-Si, Fe-Co-Ni, Mn-Bi, Mn-Bi-Sb, Mn-Al, etc.

It has been unexpectedly found that the coercive force as measured in Oersteds and the Squareness ratio of composite films produced by the invention reach desirable maximum values when the ferromagnetic material (metal or alloy) to polymer (polymer, oligomer or monomer) ratio is in the range of about 95/5 to 40/60. Most preferably this ratio is 80/20 to 60/40.

As the monomers, oligomers and polymers used in the invention, the following materials can generally be employed: olefins and their derivatives such as ethylene, propylene, isobutylene, trifluoropropylene, etc,; dienes and their derivatives such as butadiene, trichlorobutadiene, etc.; vinyl acetylenes such as vinyl acetylene, chlorovinyl acetylene, etc.; olefin halides such as vinyl chloride, vinylidene chloride, dichloroethylene, trichloroethylene, allyl chloride, etc.; acrylic and methacrylic acids and their derivatives such as acrylic acid, methacrylic acid, acrylyl morpholine, acrylpyrrolidine, etc.; acrylic esters such as ethyl acrylate, butyl acrylate, allylene diacrylate, etc.; methacrylic esters such as methyl methacrylate, $\beta$-ethyl chloroacrylate, $\beta$-ethyl ethoxymethacrylate, etc.; acrylamides and their derivatives such as acrylamide, N-n-butoxycarbonyl acrylamide, etc.; methacrylamides and their derivatives such as methacrylamide, N-o-anisyl methacrylamide, etc.; acrylonitriles or methacrylonitriles such as acrylonitrile, methacrylonitrile, $\alpha$-chloroacrylonitrile, $\alpha$-ethylacrylonitrile, etc.; vinyl esters such as vinyl acetate, vinyl monochloroacetate, vinyl trifluoroacetate, etc.; unsaturated dibasic acids and their esters such as methylallyl maleate, vinyl ethyl fumarate, etc.; allyl esters such as allyl acetate, diallyl phthalate, etc.; vinyl ketones and their derivatives such as methyl vinyl ketone, divinyl ketone, etc.; unsaturated ethers such as allyl vinyl ether, ethyl vinyl ether, divinyl ether, etc.; styrenes and their derivatives such as styrene, chlorostyrene, methyl styrene, etc.; vinyl amines and their derivatives such as vinyl isocyanate, N-vinyl ethyleneamine, etc.; maleimides and their derivatives such as maleimide, N-acetoxymethyl maleimide, etc.; sulfur containing compounds such as vinyl thioether, vinyl thioacetate, vinyl sulfonate, etc.; polycyclic hydrocarbons and heterocyclic vinyl compounds such as N-vinyl pyridine, chlorovinyl naphthalene, etc.; silicon containing compounds such as dimethyl siloxane, trichlorovinyl silane, etc.; and phenols and their derivatives such as vinyl phenol, etc. In these monomers, oligomers and polymers, materials with desired polymerization degrees can also be utilized Of the monomers, oligomers and polymers described above, dimethylpolysiloxane, polytetrafluoroethylene, trifluorochloroethylene, allyltrifluoroacetylene, perfluorobutyl methacrylate, polyethylene, polyethylene terephthalate, polypropylene, polystyrene, polycarbonate, adipic acid-hexamethylene diamine oligomer polyparaxylene, etc., are particularly preferred.

These monomers, oligomers and polymers can be placed in a reaction apparatus for vapor deposition in the form of a gas, liquid or solid. In the case of a liquid or a solid, these materials can be evaporated using heating or a sputtering technique, and then decomposed or sublimed for deposition on a substrate after they have been disposed in the reaction apparatus.

The vapor deposition techniques as described above represent techniques for depositing a material or compound thereof to be deposited on a substrate in a gaseous atmosphere or under vacuum conditions, which include the following methods. Although these conditions can be greatly changed depending on the methods and materials employed, in general these methods are conducted under the following conditions.

| | Vapor Deposition Techniques | | | | |
|---|---|---|---|---|---|
| | Vapor Deposition Method | | | | |
| Conditions | Vacuum Deposition | Sputtering | Ion Plating | Ion Beam Deposition | Chemical Vapor Deposition |
| Pressure (Torr) | $\leq 10^{-5}$ | $10^{-2} - 10^{-3}$ (Ar) | $10^{-2} - 10^{-3}$ (Ar) | $10^{-5} - 10^{-6}$ | $\leq 1$ atm (Ar) |
| Material Temperature | Evaporating Temperature | Water-Cooled | Evaporating Temperature | Above the Evaporating | Above the Evaporating |

-continued

| | Vapor Deposition Techniques | | | | |
| --- | --- | --- | --- | --- | --- |
| | Vapor Deposition Method | | | | |
| Conditions | Vacuum Deposition | Sputtering | Ion Plating | Ion Beam Deposition | Chemical Vapor Deposition |
| Deposition Rate (Å/sec) | ~several hundreds | ~several hundreds | ~several hundreds | Temperature several tens~3000 | Temperature $10^2$ |
| Deposition Thickness | ~several μm | ~several tens of μm | several tens of μm | ~several μm | ~several hundreds of μm |

Vapor deposition techniques are disclosed in L. Holland, *Vacuum Deposition of Thin Films*, Chapman & Hall, Ltd. (1956), and L. I. Maissel & R. Glang. Eds., *Handbook of Thin Film Technology*, McGraw-Hill Co. (1970), sputtering and vacuum deposition techniques are described in British Pat. 1,354,702 and ion plating techniques are described in D. M. Mattox, *Electrochemical Technology*, Vol. 2, No. 9–10, p. 295, 298 (1964).

As ionizing rays for polymerizing the deposited monomers and oligomers, electron beams (several hundreds of eV to several tens of KeV), ion beams (several tens of eV to several tens of KeV), β-rays (several tens of KeV to several MeV), α-rays (about several MeV), etc., can be used. On the other hand, microwaves (about 1 mm to 1 m in wavelength), ultraviolet rays (about 10 to 3000 Å in wavelength), X-rays (about 0.01 to 100 Å in wavelength), γ-rays (about 0.0001 to 0.1 Å in wavelength), neutron beams, proton beams, etc., can be employed as electromagnetic rays. A suitable temperature range which can be employed in the irradiation is about 10° to 80° C. and a suitable irradiation time ranges from about 0.1 to 500 seconds.

Since the value of the saturation magnetic flux $\phi m$ per unit length of the magnetic recording layer in accordance with the invention, with $\phi m$ being the product of the saturation magnetic flux density (Bm) and the thickness of the magnetic recording layer, requires a thickness sufficient to provide the output as a magnetic recording medium and sufficient to perform high density recording therefor, preferably the value of $\phi m$ ranges about 0.05 maxwell/cm to 1.5 maxwell/cm.

As polymerization catalyts which can be used in the present invention, diacyls such as acetyl peroxide, lauroyl peroxide, stearoyl peroxide, benzoyl peroxide, etc., hydroperoxide and azo compounds such as 2,2-azobisisobutyronitrile can be utilized.

In addition to the above binder and ferromagnetic powder, the magnetic recording layer can contain a dispersant, a lubricant, an antistatic agent, or other conventionally used additives.

In addition of the additives described above to the magnetic recording layer, the magnetic recording layer can be formed by vapor deposition of a mixture of the binder containing these additives along with the ferromagnetic powder.

Examples of suitable lubricants are silicone oil, carbon black, graphite, carbon black graft polymer, molybdenum disulfide, tungsten disulfide, fatty acid esters formed between monobasic fatty acids containing 12 to 16 carbon atoms and monohydric alcohols containing 3 to 12 carbon atoms, and fatty acid esters formed between monobasic fatty acids containing at least 17 carbon atoms and monohydric alcohols, thus containing 15 to 28 carbon atoms as a total of the number of carbon atoms of both the fatty acids and the alcohols. These lubricants are employed in an amount of about 0.2 to 20 parts by weight per 100 parts by weight of the binder. These lubricants are disclosed, for example, in Japanese Pat. No. 23889/68, Japanese patent application Nos. 2864/67 and 81543/68, U.S. Pat. Nos. 2,654,681 3,274,111, 3,276,946, 3,293,066, 3,398,011, 3,470,021, 3,492,235, 3,523,086, 3,625,760, 3,630,772, 3,634,253, 3,647,539, and 3,687,725, Canadian Pat. Nos. 535,575 and 728,591, British Pat. No. 793,520, and German Pat. No. (DT-AS) 1,221,282, etc.

Examples of suitable antistatic agents are natural surface active agents such as saponin; nonionic surface active agents such as alkylene oxide, glycerin or glycidol-type surfactants; cationic surface active agents such as higher alkylamines, quaternary ammonium salts, pyridine and other heterocyclic compounds, phosphonium compounds, and sulfonium compounds; anionic surface active agents containing an acidic group such as carboxylic acids, sulfonic acids, phosphoric acids, sulfuric acid esters or phosphoric acid esters; and amphoteric surface active agents such as amino acids, aminosulfonic acids, and esters formed between amino-alcohols and sulfuric acid or phosphoric acid.

Some examples of surface active agents that can be used as an antistatic agent are disclosed in U.S. Pat. Nos. 2,271,623, 2,240,472, 2,288,226, 2,676,122, 2,676,924, 2,676,975, 2,691,566, 2,727,869, 2,730,498, 2,742,379, 2,739,891, 3,968,101, 3,158,484, 3,201,253, 3,210,191, 3,294,540, 3,415,649, 3,441,413, 3,442,654, 3,475,174, and 3,545,974, German OLS 1,942,665, British Pat. Nos. 1,077,317 and 1,198,450, Ryohei Oda, *Synthesis and Application of Surface Active Agents*, Maki Shoten, Tokyo, (1964), A. W. Perry, *Surface Active Agents*, Interscience Publications Inc., (1958), J. P. Sisley, *Encyclopedia of Surface Active Agents*, Vol. 2, Chemical Publishing Company, (1964), and *Manual of Surface Active Agents*, Sangyo Tosho Kabushiki Kaisha, Tokyo, (Dec. 20, 1966).

These surface active agents can be employed alone or in combination. Although these surfactants are used primarily as antistatic agents, they are sometimes used for other purposes, for example, improvement of the magnetic characteristics, or improvement of lubricity.

Further, as supports which can be used in the invention, non-conductive materials such as polyethylene terephthalate, polyimide, polyvinyl chloride, cellulose triacetate, polycarbonate, polyethylene naphthalate, glass and ceramics, and metals such as aluminium, stainless steel and brass can be employed. These supports can also be utilized in the form of a tape, sheet, card, disc, drum or the like.

According to the present invention, magnetic recording media suitable for high density recording can be produced, and their production process is simpler than that of conventional coating type magnetic recording media, and further incidental facilities for solvent recovery and pollution control are not be required. In addition, magnetic recording media available for high density recording can be provided because magnetic recording media having better magnetic properties than those of non-binder type magnetic recording media which are being developed for high density recording.

The following examples are given to illustrate the invention in greater detail. Unless otherwise indicated, all parts, percents, ratios and the like are by weight.

EXAMPLE 1

A single film of a magnetic metal and a composite film of a magnetic metal and polytetrafluoroethylene (average molecular weight: about 300–400), each as described in Table 1, were deposited on a brass disc, respectively, using the sputtering apparatus shown in FIG. 1. In the drawing, within a vacuum chamber 1 were arranged an anode 2 and cathodes 3a, 3b which were connected to a high voltage source (not shown), respectively. The vacuum chamber 1 could be exhausted through a vacuum exhaust tube 4, and desired gases could also be introduced into the vacuum chamber 1 through a needle valve 5. The brass disc substrate 6 fixed to the anode 2 could be rotated by means of a motor 7 to produce a uniform sputtered film thereon. For producing a single film of Co, for example, a Co target could be attached to either the cathode 3a or 3b or both of the cathodes so as to carry out the sputtering. To produce the Co-polytetrafluoroethylene composite, a Co target and polytetrafluoroethylene target could be fixed on the cathodes 3a and 3b, respectively, and these materials could be sputtered at the same time from both targets by controlling the voltage at the cathodes 3a and 3b independently. A single film of the magnetic metal was formed on the substrate, keeping both the argon and the voltage of the magnetic metal target at 0.01 Torr and −2.0 KV, respectively. On the other hand, a composite film of the magnetic metal-polytetrafluoroethylene was produced on the substrate, maintaining both the pressure of argon, the voltage of the magnetic metal target and the voltage of the polytetrafluoroethylene target at 0.01 Torr, −2.0 KV and −1.3 KV, respectively. Table 1 shows the magnetic properties of the deposited magnetic films with respect to same saturation magnetic flux per unit length $\phi m$ ($\phi m$ is the product of the saturation magnetic flux density Bm and the thickness of the film).

TABLE 1

| Sample No. | Film Composition | Saturation Magnetic Flux per Unit Length ($\phi m$) (Mx/cm) | Coercive Force (Hc) (Oe) | Squareness Ratio (Br/Bm) |
| --- | --- | --- | --- | --- |
| 1-1 | Single film of Co | 0.3 | 245 | 0.45 |
| | Composite film of Co-polytetrafluoroethylene | 0.3 | 355 | 0.70 |
| 1-2 | Single film of Co . Ni alloy (Co/Ni = 4/1 by weight) | 0.2 | 275 | 0.50 |
| | Composite film of Co . Ni-polytetrafluoroethylene | 0.2 | 445 | 0.65 |
| 1-3 | Single film of Fe | 0.5 | 195 | 0.45 |

TABLE 1-continued

| Sample No. | Film Composition | Saturation Magnetic Flux per Unit Length ($\phi m$) (Mx/cm) | Coercive Force (Hc) (Oe) | Squareness Ratio (Br/Bm) |
| --- | --- | --- | --- | --- |
| | Composite film of Fe-polytetrafluoroethylene | 0.5 | 315 | 0.70 |

EXAMPLE 2

A sheet shaped polyethylene terephthalate support with a thickness of 38 μm was dipped into benzoyl peroxide and coated therewith. Then a magnetic metal and linear oligoamide (adipic acid-hexamethylene diamine oligomer; degree of polymerization: 3–4), each as described in Table 2, were simultaneously evaporated in a vacuum of $10^{-5}$ Torr from separate evaporating sources using a usual vacuum evaporating apparatus, so that a composite film was deposited on the support coated with the peroxide. Thereafter, cobalt 60 radiation was applied to the composite film for 5 minutes, and the composite film was polymerized to obtain a composite magnetic metal-polymer film. Then the magnetic properties of the composite films thus produced were compared with those of single films of a magnetic metal which were produced under a vacuum of $10^{-5}$ Torr using the same vacuum evaporating apparatus, and the results are shown in the following Table 2. The comparison was carried out with respect to films each having the same saturation magnetic flux per unit length ($\phi m$).

TABLE 2

| Sample No. | Film Composition | Saturation Magnetic Flux per Unit Length ($\phi m$) (Mx/cm) | Coercive Force (Hc) (Oe) | Squareness Ratio (Br/Bm) |
| --- | --- | --- | --- | --- |
| II-1 | Single film of Co | 0.1 | 280 | 0.60 |
| | Composite film of Co-polymer | 0.1 | 595 | 0.70 |
| II-2 | Single film of Co—Cr alloy (Co/Cr = 19/1 by weight) | 0.5 | 180 | 0.60 |
| | Composite film of Co . Cr-polymer | 0.5 | 295 | 0.75 |
| II-3 | Single film of Co—Cu alloy (Co/Cu = 9/1 by weight) | 0.3 | 280 | 0.60 |
| | Composite film of Co . Cu-polymer | 0.3 | 625 | 0.70 |

As described above, composite magnetic metal-polymer films have good magnetic properties as compared with those of single films of magnetic metals.

EXAMPLE 3

A composite film of Co-Fe-Ni alloy (80:5:15 by weight ratio) and polycarbonate (average molecular weight: about 1000) was formed on a substrate of a polyimide tape [Kapton, a polyimide resin, made by Dupont Co., in U.S.A.] with a thickness of 25 μm and a width of ½ inch, using a usual ion plating apparatus. In this case, after a glow discharge was carried out at an argon pressure of 0.03 Torr at a voltage of 2 KV to clean the polyimide surface, Co-Fe-Ni alloy and polycarbonate were simultaneously evaporated from separate evaporating sources at a voltage of 1.5 KV to perform the ion plating. The magnetic properties of the magnetic tape thus produced are shown in the following Table 3.

TABLE 3

| No. | Sample | Saturation Magnetic Flux per Unit Length ($\phi$m) (Mx/cm) | Coercive Force (Hc) (Oe) | Squareness Ratio (Br/Bm) | Saturation Magnetic Flux Density (Bm) (Gauss) |
|---|---|---|---|---|---|
| III-1 | Magnetic Tape According to the Invention | 0.25 | 775 | 0.72 | 6100 |
| III-2 | Electroless Plating Tape for Comparison | 0.25 | 790 | 0.71 | 6300 |

The recording and reproducing characteristics of the magnetic tape in this embodiment was compared with that of a plating tape with nearly similar magnetic properties to the described above. The results obtained are shown in FIG. 2.

Figure 2:
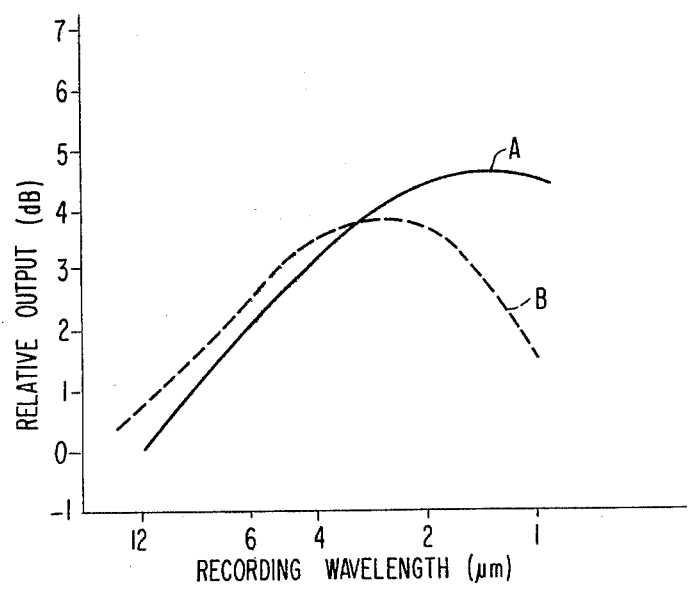
FIG. 2 is a graph showing the reproducing output of a magnetic tape A in accordance with the invention as compared with that of conventional non-binder type magnetic tape B.

The output property of the magnetic tape in accordance with the invention is shown by Curve A in FIG. 2, in comparison with that obtained using a conventional non-binder type plating tape, shown by Curve B in FIG. 2.

According to the method of this invention, a magnetic tape having better magnetic properties than those of a conventional magnetic tape produced by ion plating a support with only a magnetic metal can be obtained. Further a magnetic tape having a higher magnetic output in the short recording wavelength region than that of a conventional non-binder type plating tape can be obtained, so that magnetic tapes available for use in high density recording are achieved.

EXAMPLE 4

Figure 3:
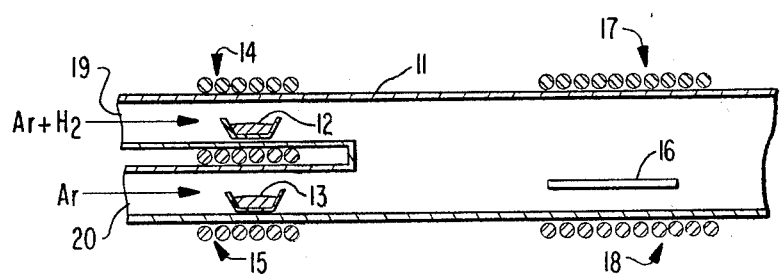
FIG. 3 is a schematic view of another production apparatus for producing magnetic recording media according to another embodiment of the invention.

After a composite film of Co-silicone oil (dimethylpolysiloxane; average molecular weight: about 344) was deposited on a copper plate, using the apparatus shown in FIG. 3, an electron beam accelerated to 2.5 KV was applied thereto to produce a composite ferromagnetic material-polymer film. In FIG. 3, vapor sources 12 and 13, CoCl$_3$ for the Co and silicone oil for the polymer, were placed in a reaction tube 11 and then heated to 80° C. and 250° C. with heaters 14 and 15, respectively. A copper support 16 was also placed in the reaction tube 11 and heated to 400° C. with heaters 17 and 18. When a mixed gas of Ar+H$_2$ as a carrier gas and Ar gas as a carrier gas were introduced into the reaction tube 11 from gas supply pipes 19 and 20, a composite Co-silicone film was deposited on the copper support 16. An electron beam was then applied for 5 minutes to the composite film thus obtained to promote the progress of the polymerization thereof, so that a composite Co-polymer film would be produced on the copper substrate 16. On the other hand, only the vapor source 12 for Co was placed in the reaction tube 11 to deposit a single film of Co on the copper support 16. The following Table 5 shows the magnetic properties of these single and composite films with respect to the same saturation magnetic flux per unit length ($\phi$m).

TABLE 5

| Sample No. | Film Composition | Saturation Magnetic Flux per Unit Length ($\phi$m) (Mx/cm) | Coercive Force (Hc) (Oe) | Squareness Ratio (Br/Bm) |
|---|---|---|---|---|
| V-1 | Single film of Co | 0.5 | 115 | 0.50 |
|  | Composite film of Co-polymer | 0.5 | 305 | 0.65 |
| V-2 | Single film of Co | 1.0 | 160 | 0.65 |
|  | Composite film of Co-polymer | 1.0 | 355 | 0.65 |

It will be apparent from the results in Table 5 that the composite Co-polymer film has good magnetic properties as compared with those of the single film of Co.

EXAMPLE 5

Co-Fe alloy (85:15 by weight), polyparaxylene (tetramer) and polystyrene (pentamer) from separate evaporating sources were simultaneously evaporated onto a polyethylene naphthalate tape having a thickness of 22 $\mu$m and a width of ½ inch, using a continuous evaporating apparatus, thereby to produce a magnetic tape composed of a composite magnetic material-polymer film. The magnetic properties and the recording and reproducing characteristics of the composite film thus obtained and of a single film produced by depositing only the Co-Fe alloy on the tape are shown in the following Tables 6 and 7.

TABLE 6

| | | Magnetic Properties | | |
|---|---|---|---|---|
| No. | Sample | Saturation Magnetic Flux per Unit Length ($\phi$m) (Mx/cm) | Coercive Force (Hc) (Oe) | Squareness Ratio (Br/Bm) |
| VI-1 | Magnetic Tape Produced Using Composite Film | 0.2 | 420 | 0.70 |
| VI-2 | Magnetic Tape Produced Using Single Film | 0.2 | 115 | 0.55 |

TABLE 7

| | Reproduction Output Level (Relative Value) | |
|---|---|---|
| Recording Wavelength ($\mu$m) | Magnetic Tape Produced Using Composite Film (VI-1) (dB) | Magnetic Tape Produced Using Single Film (VI-2) (dB) |
| 12 | 1 | 0 |
| 4 | 3 | −1 |
| 2 | 5 | −5 |

It can be seen from the results in Tables 6 and 7 that magnetic tapes having better magnetic properties and higher reproduction output than those of magnetic tapes produced by the deposition of only ferromagnetic materials can be obtained and that high density recording is possible.

According to the present invention as is apparent from the described embodiments, magnetic recording media suitable for high density recording can be produced which have higher magnetic properties and higher output at short recording wavelengths than those of conventional non-binder type magnetic recording media which have been developed for high density recording. In addition, the magnetic recording media of this invention can be produced by only one process as compared with production processes for conventional coating type magnetic recording media such as a production of magnetic materials, a production of coating solutions and the coating process. Therefore, the magnetic recording media of this invention can be produced by an easier process than that of conventional one.

While the invention has been described in detail and with reference to specific embodiments thereof, it will be apparent to one skilled in the art that various changes and modifications can be made therein without departing from the spirit and scope thereof.

What is claimed is:

1. A method of producing a magnetic recording medium comprising vapor depositing simultaneously (1) a ferromagnetic metal or alloy material, (2) a polymer, and (3) a dispersant, a lubricant or an anti-static agent onto a non-magnetic support to provide a magnetic recording layer thereon, wherein said vapor depositing is performed by vacuum depositing, sputtering or ion plating, and wherein the weight ratio of said ferromagnetic metal or alloy material (1) to polymer (2) deposited on said support is in the range of about 95/5 to 40/60.

2. The method of producing a magnetic recording medium of claim 1, wherein said ferromagnetic material is Fe, Co, Ni, Fe-Co, Fe-Ni, Co-Ni, Fe-Rh, Fe-Cu, Fe-Au, Co-Cu, Co-Au, Co-Y, Co-La, Co-Pr, Co-Gd, Co-Ga, Co-Sm, Co-Pt, Ni-Cu, Fe-Si, Fe-Co-Ni, Mn-Bi, Mn-Bi-Sb, Mn-Al, or a mixture thereof.

3. The method of producing a magnetic recording medium of claim 1, wherein said polymer is a polyolefin, a diene polymer, a polyvinyl acetylene, a polyolefin halide, a polyacrylic acid, a polymethacrylic acid, a polyacrylate, a polymethacrylate, a polyacrylamide, a polymethacrylamide, a polyacrylonitrile, a polymethacrylonitrile, a polyvinyl ester, a polymer of an unsaturated dibasic acid or ester thereof, a polyallyl ester, a polyvinyl ketone, an unsaturated ether polymer, a polystyrene, a polyvinylamine, a polymaleimide, a sulfo group containing polyvinyl polymer, a polycyclic hydrocarbon polymer, a heterocyclic vinyl polymer, a silicone polymer, a phenolic polymer, or a mixture thereof.

4. The method of producing a magnetic recording medium of claim 1, wherein said polymer is dimethylpolysiloxane, polytetrafluoroethylene, trifluorochloroethylene, allyltrifluoroacetylene, perfluorobutyl methacrylate, polyethylene, polyethylene terephthalate, polypropylene, polystyrene, polycarbonate or polyparaxylene.

5. The method of producing a magnetic recording medium of claim 1, wherein said vapor depositing is performed by sputtering; the ferromagnetic material is Co, Co.Ni alloy in a Co/Ni weight ratio of 4/1 or Fe; and the polymer is polytetrafluoroethylene.

6. The method of producing a magnetic recording medium of claim 1, wherein said support is polyethylene terephthalate, polyimide, polyvinyl chloride, cellulose triacetate, polycarbonate, polyethylene naphthalate, glass, ceramic, aluminum, stainless steel or brass.

7. The method of producing a magnetic recording medium of claim 1, wherein said weight ratio is 80/20 to 60/40.

8. The method of producing a magnetic recording medium of claim 1, wherein said vapor depositing is performed by ion plating; the ferromagnetic material is Co.Fe.Ni alloy in a Co/Fe/Ni weight ratio of 80/5/15; and the polymer is polycarbonate.

9. A method of producing a magnetic recording medium comprising vapor depositing simultaneously (1) a ferromagnetic metal or alloy material, (2) a monomer or an oligomer, and (3) a dispersant, a lubricant or an anti-static agent onto a non-magnetic support to provide a magnetic recording layer thereon, wherein said vapor depositing is performed by vacuum depositing, sputtering or ion plating, wherein the weight ratio of said ferromagnetic metal or alloy material (1) to said monomer or oligomer (2) deposited on said support is in the range of about 95/5 to 40/60.

10. The method of producing a magnetic recording medium of claim 9, wherein said ferromagnetic material is Fe, Co, Ni, Fe-Co, Fe-Ni, Co-Ni, Fe-Rh, Fe-Cu, Fe-Au, Co-Cu, Co-Au, Co-Y, Co-La, Co-Pr, Co-Gd, Co-Ga, Co-Sm, Co-Pt, Ni-Cu, Fe-Si, Fe-Co-Ni, Mn-Bi, Mn-Bi-Sb, Mn-Al or a mixture thereof.

11. The method of producing a magnetic recording medium of claim 9, wherein said monomer or said oligomer is an olefin, a diene, a vinyl acetylene, an olefin halide, acrylic acid, methacrylic acid, an acrylate, a methacrylate, an acrylamide, a methacrylamide, acrylonitrile, methacrylonitrile, a vinyl ester, an unsaturated dibasic acid or an ester thereof, an allyl ester, a vinyl ketone, an unsaturated ether, a styrene, a vinyl amine, a maleimide, a sulfo group containing vinyl compound, a polycyclic hydrocarbon, a heterocyclic vinyl compound, a silicone compound, a phenol, an oligomer of these monomers, or a mixture thereof.

12. The method of producing a magnetic recording medium of claim 9, wherein said monomer or said oligomer is polymerized with a polymerization catalyst.

13. The method of producing a magnetic recording medium of claim 12, wherein said polymerization catalyst is coated upon the support prior to said simultaneous vapor depositing.

14. The method of producing a magnetic recording medium of claim 1, wherein said ferromagnetic metal or alloy material, said polymer, and said dispersant, lubricant or anti-static agent are vapor deposited from separate evaporating sources.

15. The method of producing a magnetic recording medium of claim 9, wherein said monomer or said oligomer is polymerized by irradiating said deposited layer.

16. The method of producing a magnetic recording medium of claim 9, wherein said support is polyethylene terephthalate, polyimide, polyvinyl chloride, cellulose triacetate, polycarbonate, polyethylene naphthalate, glass, ceramic, aluminum, stainless steel or brass.

17. The method for producing a magnetic recording medium of claim 9, wherein said ferromagnetic metal or alloy material, said polymer, and said dispersant, lubricant or anti-static agent are vapor deposited from separate evaporating sources.

18. The method of producing a magnetic recording medium of claim 9, wherein said weight ratio is 80/20 to 60/40.

19. The method of producing a magnetic recording medium of claim 9, wherein said monomer or oligomer is polymerized with benzoyl peroxide which is coated upon the support prior to said simultaneous vapor depositing; the vapor depositing is performed by vacuum depositing; the ferromagnetic material is Co, Co.Cr alloy in a Co/Cr weight ratio of 19/1 or a Co.Cu alloy in a Co/Cu weight ratio of 9/1; and the monomer or oligomer is adipic acid-hexamethylene diamine oligomer.

* * * * *